(12) United States Patent
Suzuki et al.

(10) Patent No.: US 9,772,461 B2
(45) Date of Patent: Sep. 26, 2017

(54) SEMICONDUCTOR INTEGRATED CIRCUIT AND METHOD FOR MANUFACTURING THE SAME

(71) Applicant: Photonics Electronics Technology Research Association, Tokyo (JP)

(72) Inventors: Yasuyuki Suzuki, Tokyo (JP); Kenichiro Yashiki, Tokyo (JP); Kazuhiko Kurata, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 14 days.

(21) Appl. No.: 15/023,351

(22) PCT Filed: Oct. 1, 2014

(86) PCT No.: PCT/JP2014/076306
§ 371 (c)(1),
(2) Date: Mar. 18, 2016

(87) PCT Pub. No.: WO2015/050167
PCT Pub. Date: Apr. 9, 2015

(65) Prior Publication Data
US 2016/0266333 A1 Sep. 15, 2016

(30) Foreign Application Priority Data
Oct. 2, 2013 (JP) .................................. 2013-206966

(51) Int. Cl.
*G02B 6/12* (2006.01)
*G02B 6/136* (2006.01)
(Continued)

(52) U.S. Cl.
CPC ............... *G02B 6/428* (2013.01); *G02B 6/12* (2013.01); *G02B 6/122* (2013.01); *G02B 6/136* (2013.01);
(Continued)

(58) Field of Classification Search
None
See application file for complete search history.

(56) References Cited

U.S. PATENT DOCUMENTS

| 5,644,667 A | 7/1997 | Tabuchi |
| 5,764,832 A | 6/1998 | Tabuchi |

(Continued)

FOREIGN PATENT DOCUMENTS

| JP | H06-275870 A | 9/1994 |
| JP | 2008-026868 A | 2/2008 |
| JP | 2012-174884 A | 9/2012 |

OTHER PUBLICATIONS

International Search Report issued in Application No. PCT/JP2014/076306, mailed Dec. 22, 2014.

*Primary Examiner* — Jerry Rahll
(74) *Attorney, Agent, or Firm* — Michael Best & Friedrich LLP (57) ABSTRACT

A semiconductor integrated circuit that reduces a loss in an electrical signal and a method for manufacturing the semiconductor integrated circuit are provided. The semiconductor integrated circuit comprises a first region on which an optical circuit is to be formed and a second region on which an electrical signal wiring is to be formed. The first region comprises an Si substrate (502), a BOX layer (504) formed on the Si substrate (502), a first SOI layer (506) formed as an optical circuit on the BOX layer (504), and a first SiO$_2$ layer (508) formed on the first SOI layer (506). The second region comprises the Si substrate (502), the BOX layer (504), a second SiO$_2$ layer (508) formed on the BOX layer (504), and an electrical signal wiring (510) formed on the second SiO$_2$ layer (508).

10 Claims, 8 Drawing Sheets

(51) Int. Cl.
  *G02B 6/42*   (2006.01)
  *G02B 6/122*  (2006.01)
  H01L 25/065   (2006.01)
  H01L 25/07    (2006.01)
  H01L 25/18    (2006.01)
  G02F 1/025    (2006.01)

(52) U.S. Cl.
  CPC .... *G02B 2006/12061* (2013.01); *G02F 1/025* (2013.01); *H01L 25/065* (2013.01); *H01L 25/07* (2013.01); *H01L 25/18* (2013.01); *H01L 2224/16225* (2013.01)

(56) References Cited

U.S. PATENT DOCUMENTS

| | | | |
|---|---|---|---|
| 9,341,776 B2 * | 5/2016 | Iizuka | G02B 6/131 |
| 2005/0063637 A1 * | 3/2005 | Mershon | G02B 6/4214 |
| | | | 385/15 |
| 2006/0105479 A1 * | 5/2006 | Cave | H01L 27/144 |
| | | | 438/22 |
| 2007/0253663 A1 * | 11/2007 | Keyser | G02B 6/12 |
| | | | 385/36 |
| 2007/0262327 A1 | 11/2007 | Shimooka | |
| 2009/0263923 A1 | 10/2009 | Shimooka | |
| 2014/0044391 A1 * | 2/2014 | Iizuka | G02B 6/131 |
| | | | 385/14 |
| 2016/0282554 A1 * | 9/2016 | Watanuki | G02B 6/122 |

\* cited by examiner

SEMICONDUCTOR INTEGRATED CIRCUIT AND METHOD FOR MANUFACTURING THE SAME

TECHNICAL FIELD

The present invention relates to a semiconductor integrated circuit and a method for manufacturing the circuit, and, more specifically, to a semiconductor integrated circuit that reduces a loss in an electrical signal and a method for manufacturing the circuit.

BACKGROUND ART

In the case that a semiconductor integrated circuit is formed by use of a silicon photonics technique, a buried oxide (BOX) layer is formed on a silicon (Si) substrate, and an optical circuit comprising an optical element, an optical waveguide, and so on is formed as an SOI (Silicon on Insulator) layer (Si layer) on the BOX layer.

Figure 1:
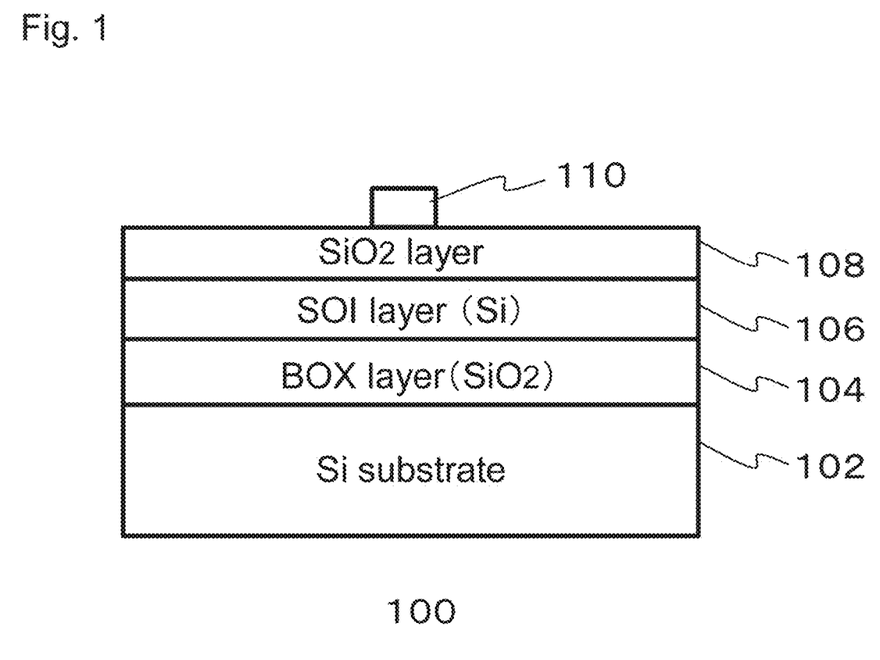
FIG. 1 is a schematic cross-section view of a prior-art semiconductor integrated circuit.

In the case that a semiconductor integrated circuit such as that explained above is used in a transmitter and/or a receiver of an optical communication system, an electrical signal wiring is formed on an SOI substrate. FIG. 1 shows a cross-section view of a prior-art semiconductor integrated circuit 100. A BOX layer 104 is formed on an Si substrate 102, an SOI layer 106 comprising an optical circuit is formed on the BOX layer 104, and an $SiO_2$ layer 108 is formed on the SOI layer 106. Further, an electrical signal wiring 110 comprising aluminum (Al) or the like is formed on the $SiO_2$ layer 108.

Figure 2:
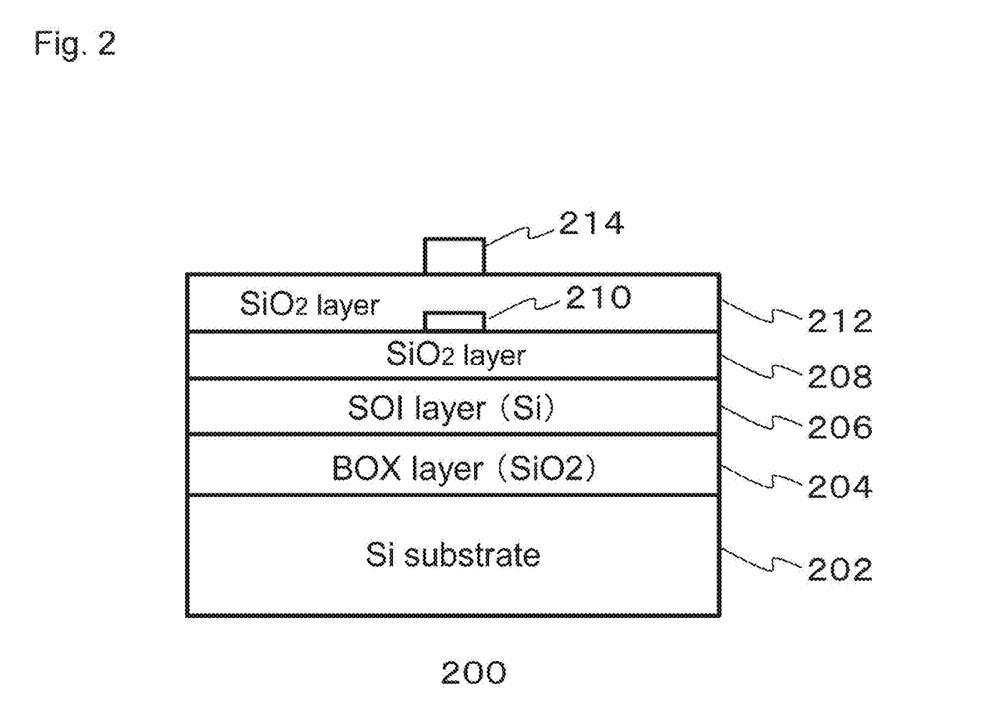
FIG. 2 is a schematic cross-section view of a prior-art semiconductor integrated circuit.

FIG. 2 shows a cross-section view of another prior-art semiconductor integrated circuit 200. A BOX layer 204 is formed on an Si substrate 202, an SOI layer 206 comprising an optical circuit is formed on the BOX layer 204, and an $SiO_2$ layer 208 is formed on the SOI layer 206. A first electrical signal wiring 210 and an $SiO_2$ layer 212 are formed on the $SiO_2$ layer 208, and a second electrical signal wiring 214 is formed on the $SiO_2$ layer 212.

In the semiconductor integrated circuits shown in FIGS. 1 and 2, the insertion loss in each of the electrical signal wirings 110, 210, and 214 is large.

SUMMARY OF INVENTION

Technical Problem

The embodiments of the present invention provide a semiconductor integrated circuit that reduces a loss in an electrical signal and a method for manufacturing the circuit.

Solution to Problem

In an embodiment of the present invention, a semiconductor integrated circuit is configured to comprise a first region on which an optical circuit is to be formed and a second region on which an electrical signal wiring is to be formed. The first region is configured to comprise a silicon (Si) substrate, a buried oxide (BOX) layer formed on the Si substrate, a first SOI (Silicon on Insulator) layer formed as an optical circuit on the BOX layer, and a first $SiO_2$ layer formed on the first SOI layer. The second region is configured to comprise the Si substrate, the BOX layer, a second $SiO_2$ layer formed on the BOX layer, and an electrical signal wiring formed on the second $SiO_2$ layer.

In an embodiment of the present invention, the semiconductor integrated circuit may be configured to further comprise an IC that is flip-chip mounted on the first $SiO_2$ layer and on the electrical signal wiring.

In an embodiment of the present invention, the semiconductor integrated circuit may be configured in such a manner that a second SOI layer is formed on a part of the box layer in the second region. The length of the second SOI layer may be set to be equal to or less than one-fourth of a wavelength of an electrical signal that is designed to propagate through the electrical signal wiring.

In an embodiment of the present invention, a method for manufacturing a semiconductor integrated circuit is a method for manufacturing a semiconductor integrated circuit comprising a first region on which an optical circuit is to be formed and a second region on which an electrical signal wiring is to be formed. The method comprises forming a silicon (Si) substrate; forming a BOX layer on the Si substrate; forming an SOI layer on the BOX layer; masking a part of the SOI layer, in which the optical circuit of the first region is to be formed; etching an unmasked part of the SOI layer, wherein a first SOI layer including the optical circuit is formed in the first region; removing the mask, and forming a first $SiO_2$ layer and a second $SiO_2$ layer on the first SOI layer and on the BOX layer in the second region, respectively; and forming an electrical signal wiring on the second $SiO_2$ layer.

The embodiment of the method according to the present invention may comprise flip-chip mounting an IC on the first $SiO_2$ layer and on the electrical signal wiring.

In the embodiment of the method according to the present invention, the masking may comprise masking a portion of a part of the SOI layer that corresponds to the second region. In such a case, a second SOI layer is formed on a part of the BOX layer in the second region. The length of the second SOI layer may be equal to or less than one-fourth of a wavelength of an electrical signal that is designed to propagate through the electrical signal wiring.

DESCRIPTION OF EMBODIMENTS

Embodiments of the present invention will be explained below with reference to the figures.

The inventors of the present invention discovered that, in the semiconductor integrated circuits 100 and 200 as shown in FIGS. 1 and 2, insertion losses in electrical signal wirings are large, since the SOI layers 106 and 206 are electrically conductive; and that, due to such an insertion loss, it is difficult to form a low-loss electrical signal wiring having a length of several millimeters in a semiconductor integrated circuit manufactured by use of a silicon photonics technique. In addition, the inventors of the present invention discovered that an insertion loss in an electrical signal wiring can be reduced by removing an SOI layer placed under the electrical signal wiring.

Figure 3:
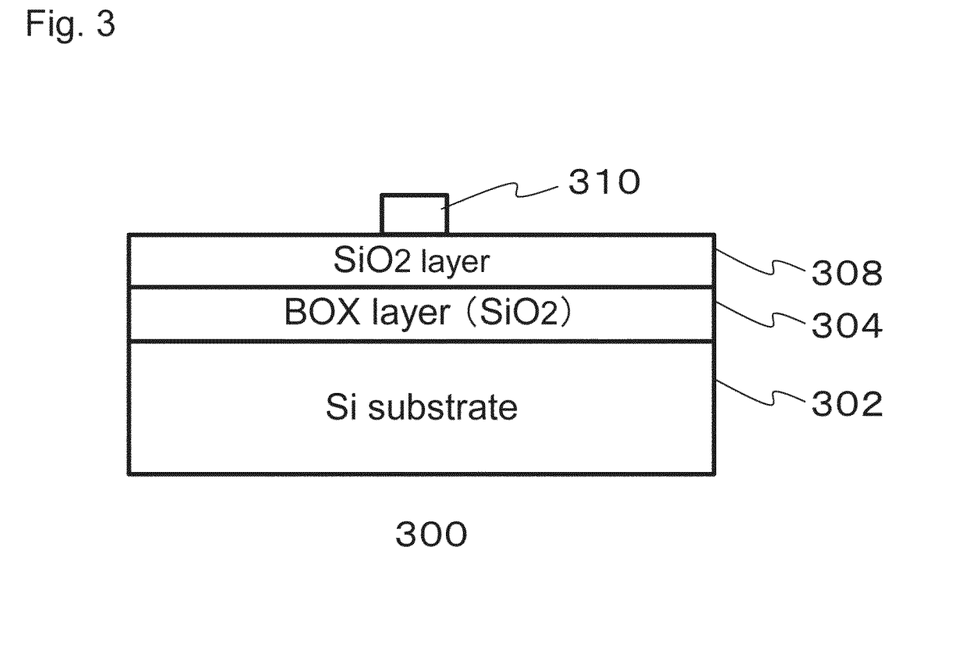
FIG. 3 is a schematic cross-section view of a semiconductor integrated circuit that does not have an SOI layer.

FIG. 3 is a schematic cross-section view of a semiconductor integrated circuit 300 that does not have an SOI layer. The semiconductor integrated circuit 300 comprises an Si layer 302, a BOX layer 304, an $SiO_2$ layer 308, and an electrical signal wiring 310. No SOI layers exist between the BOX layer 304 and the $SiO_2$ layer 308.

Figure 4:
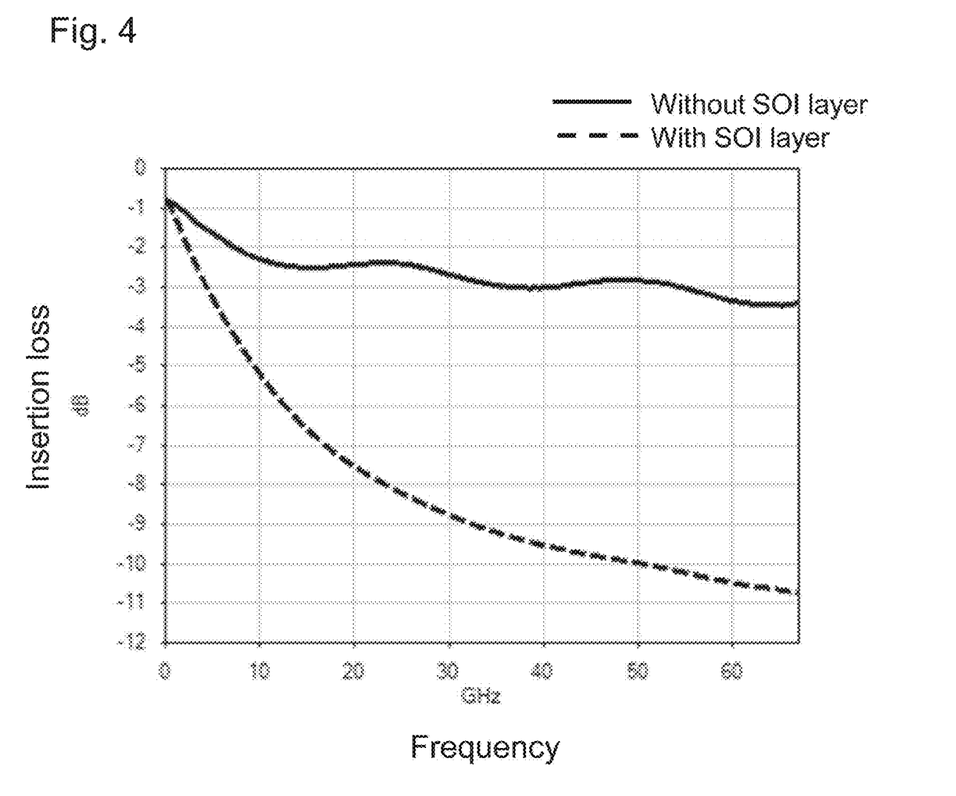
FIG. 4 is a graph showing relationships between frequencies of inputted electrical signals and insertion losses with respect to the semiconductor integrated circuit shown in FIG. 1 and the semiconductor integrated circuit shown in FIG. 3.

FIG. 4 is a graph showing results of measurements of relationships between frequencies of electrical signals inputted to the signal wirings 110 and 310 and insertion losses, with respect to the semiconductor integrated circuit 100 shown in FIG. 1 and the semiconductor integrated circuit 300 shown in FIG. 3. In this example, the thickness and the resistivity of each of the Si substrates 102 and 302 are 500 μm and 20 Ωcm, the thickness of each of the BOX layers 104 and 304 is 3 μm, the thickness and the resistivity of the SOI layer 106 are 0.2 μm and 20 Ωcm, and the thickness of each of the $SiO_2$ layers 108 and 308 is 1 μm. Each of the signal wirings 110 and 310 is a GSSG coplanar line having a thickness of 1 μm and a length of 3 mm. In FIG. 4, the broken line corresponds to the semiconductor integrated circuit 100 shown in FIG. 1, and the solid line corresponds to the semiconductor integrated circuit 300 shown in FIG. 3.

As would be understood from FIG. 4, in the semiconductor integrated circuit 100 including the SOI layer 106, the insertion loss in the signal wiring 110 drastically increases as the frequency of the electrical signal becomes large. For example, regarding the example shown in FIG. 1, the insertion loss is approximately 5 dB for the frequency of 10 GHz, and the insertion loss is approximately 9.5 dB for the frequency of 40 GHz. On the other hand, in the case of the semiconductor integrated circuit 300 that does not include an SOI layer, the insertion loss in the signal wiring 310 is small. For example, regarding the example shown in FIG. 3, the insertion loss is approximately 2.5 dB for the frequency of 10 GHz, and the insertion loss is approximately 3 dB for the frequency of 40 GHz.

However, in reality, in the case that a semiconductor integrated circuit, that can be used in a transmitter or the like in an optical communication system, is manufactured by use of a silicon photonics technique, it is necessary to form an SOI layer comprising an optical waveguide, an optical modulator, and so on. Thus, the performance of such a semiconductor integrated circuit is degraded due to increase of an insertion loss in an electrical signal wiring such as that shown in FIG. 4.

Figure 5:
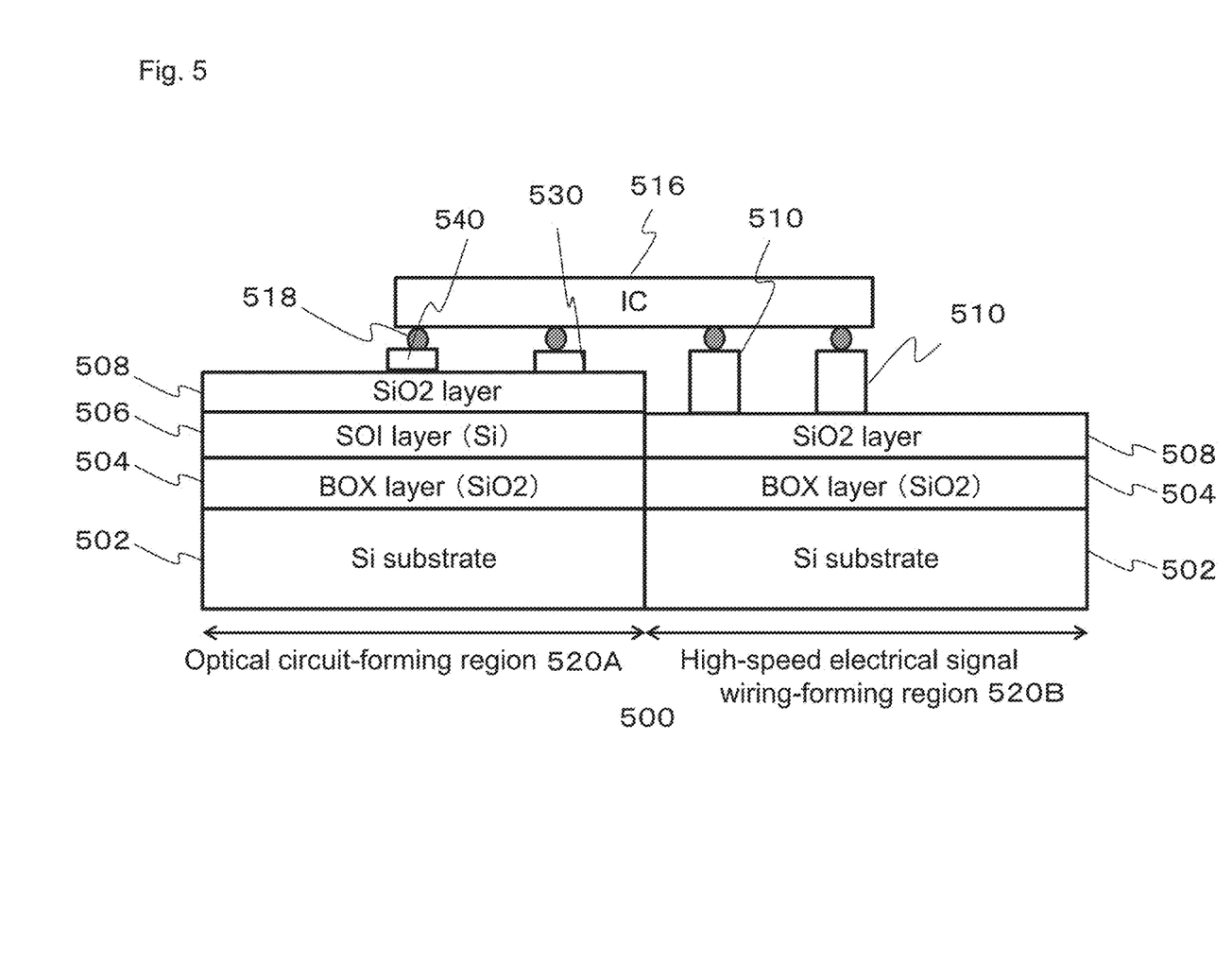
FIG. 5 is a schematic cross-section view of a semiconductor integrated circuit according to an embodiment of the present invention.

FIG. 5 is a schematic cross-section view of a semiconductor integrated circuit 500 that can reduce an insertion loss of an electrical signal, according to an embodiment of the present invention. The semiconductor integrated circuit 500 can be used in a transmitter in an optical communication system, for example. The semiconductor integrated circuit 500 comprises a region 520A in which an optical circuit is to be formed (hereinafter, "optical circuit-forming region"), and a region 520B in which a high-speed electrical signal wiring is to be formed (hereinafter, "high-speed electrical signal wiring-forming region"). The optical circuit-forming region 520A and the high-speed electrical signal wiring-forming region 520B comprise a shared Si substrate 502 and a shared BOX layer 504. In the optical circuit-forming region 520A, an optical circuit comprising an optical waveguide, an optical modulator, and so on is formed as an SOI layer 506 on the BOX layer 504, and an $SiO_2$ layer 508 is formed on the SOI layer 506. On the other hand, the high-speed electrical signal wiring-forming region 520B does not comprise any SOI layers. In the high-speed electrical signal wiring-forming region 520B, an $SiO_2$ layer 508 is formed on the BOX layer 504, and a high-speed electrical signal wiring 510 is formed on the $SiO_2$ layer 508. In the optical circuit-forming region 520A, it may be possible to form, on the $SiO_2$ layer 508, a low-speed electrical signal wiring, a ground wiring, a wiring 530 for supplying power, and an electrode 540 for supplying a high-speed signal to a modulator.

That is, the semiconductor integrated circuit 500 according to the embodiment of the present invention is configured in such a manner that the first region 520A in which an optical circuit is to be formed and the second region 520B in which an electrical signal wiring is to be formed are arranged to be separated, at least partially, from each other. The first region 520A comprises the Si substrate 502, the BOX layer 504 formed on the Si substrate 502, the first SOI layer 506 formed as an optical circuit on the BOX layer 504, and the first $SiO_2$ layer 508 formed on the first SOI layer 506. The second region 520B comprises the Si substrate 502 that is shared with the first region 520A, the BOX layer 504 that is shared with the first region 520A, the second $SiO_2$ layer 508 formed on the BOX layer 504, and the electrical signal wiring 510 formed on the second $SiO_2$ layer.

In an embodiment, it may be possible to configure the second region 520B in such a manner that a second SOI layer (not shown in the figure) is formed on a part of the BOX layer 504. In such a case, the length of the continuous second SOI layer just below the high-speed electrical signal wiring 510 may be set to be equal to or less than one-fourth of a wavelength of an electrical signal that is designed to propagate through the electrical signal wiring 510.

According to the embodiment of the present invention shown in FIG. 5, the semiconductor integrated circuit 500 comprises the optical circuit-forming region 520A and the electrical signal wiring-forming region 520B that are formed in such a manner that they are arranged to be separated, at least partially, from each other. The optical circuit-forming region 520A comprises the SOI layer 506, and at least a part of the electrical signal wiring-forming region 520B does not comprise an SOI layer. Thus, according to the embodiment of the present invention, the loss in an electrical signal propagating through the electrical signal wiring 510 is relatively small, when compared with that in a semiconductor integrated circuit manufactured by use of a prior-art silicon photonics technique.

Further, as shown in FIG. 5, in the embodiment of the present invention, an IC chip 516 is flip-chip mounted, via bumps 518, on the $SiO_2$ layer 508 in the optical circuit-forming region 520A and the electrical signal wiring 510 in the high-speed electrical signal wiring-forming region 520B. A high-speed electrical signal is supplied to the electrode pad 540 of a modulator, etc., through the high-speed electrical signal wiring-forming region 520B and the IC chip and via the bump of the IC chip. Thus, according to the embodiment of the present invention, an optical circuit such as a modulator, which is modulated with a high-speed signal, is placed in the optical circuit-forming region 520A; however, the length of a wiring required for wiring between a pad for a modulator and the modulator is made to be very short. Thus, in the optical circuit-forming region 520A in the semiconductor integrated circuit 500 according to the embodiment of the present invention, the loss in an electrical signal due to an electrical wiring is so small that it may be ignored, compared with a semiconductor integrated circuit manufactured by use of a prior-art silicon photonics technique.

Figure 6:
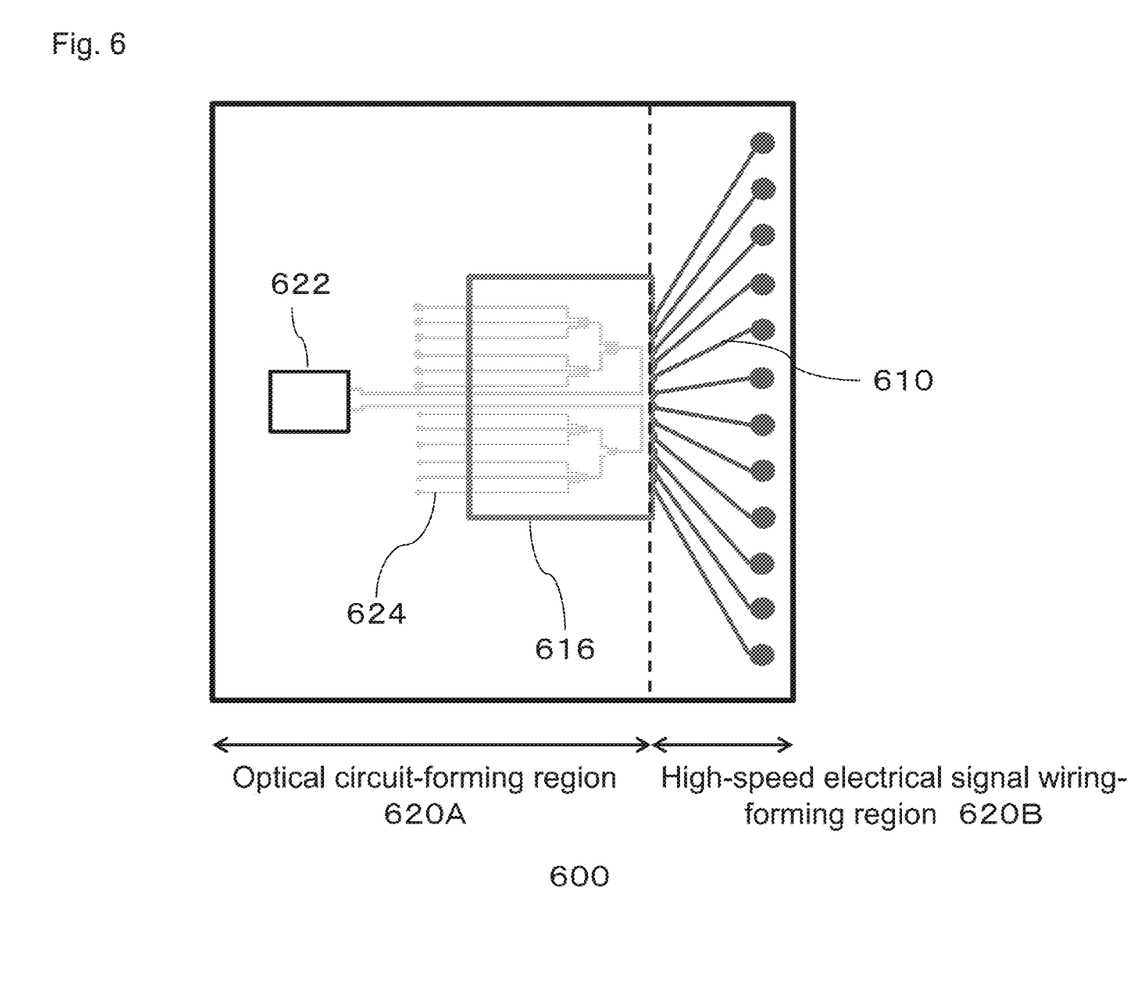
FIG. 6 is a schematic top view of a semiconductor integrated circuit according to an embodiment of the present invention.

FIG. 6 is a schematic top view of a semiconductor integrated circuit 600 according to an embodiment of the present invention and corresponding to the embodiment shown in FIG. 5. The semiconductor integrated circuit 600 shown in FIG. 6 may be used in a transmitter in an optical communication system, for example. The semiconductor integrated circuit 600 comprises an optical circuit-forming region 620A and an electrical signal wiring-forming region 620B. In the optical circuit-forming region 620A, a semiconductor laser 622, an optical circuit 624 comprising an optical modulator, an optical waveguide, and so on, and a driver IC 616 for the optical circuit 624 are formed, for example. In the electrical signal wiring-forming region 620B, electrical signal wirings 610 are formed. The driver IC 616 is flip-chip mounted. An electrical signal inputted to the semiconductor integrated circuit 600 propagates through the electrical signal wirings 610 formed in the electrical signal wiring-forming region 620B, and the signal is used, via the driver IC 616, to drive the optical circuit 624 (for example, an optical modulator). As shown in FIG. 6, the optical circuit-forming region 620A and the electrical signal wiring-forming region 620B are formed in such a manner that the two regions are arranged to be separated, at least partially, from each other. Specifically, as explained with reference to FIG. 5 in the above, although the optical circuit-forming region 620A comprises an SOI layer, the electrical signal wiring-forming region 620B does not comprise any SOI layers, basically. In a different embodiment, a part of the electrical signal wiring-forming region 620B may comprise an SOI layer. In such a case, the length of the SOI layer in the electrical signal wiring-forming region 620B may be set to be equal to or less than one-fourth of a wavelength of an electrical signal that is designed to propagate through the electrical signal wirings 610 in the electrical signal wiring-forming region 620B. In the case that the length of the SOI layer in the electrical signal wiring-forming region 620B is set to be equal to or less than one-fourth of the wavelength of the electrical signal, the loss in the electrical signal due to the electrical signal wirings 610 is made to be small.

Figure 7:
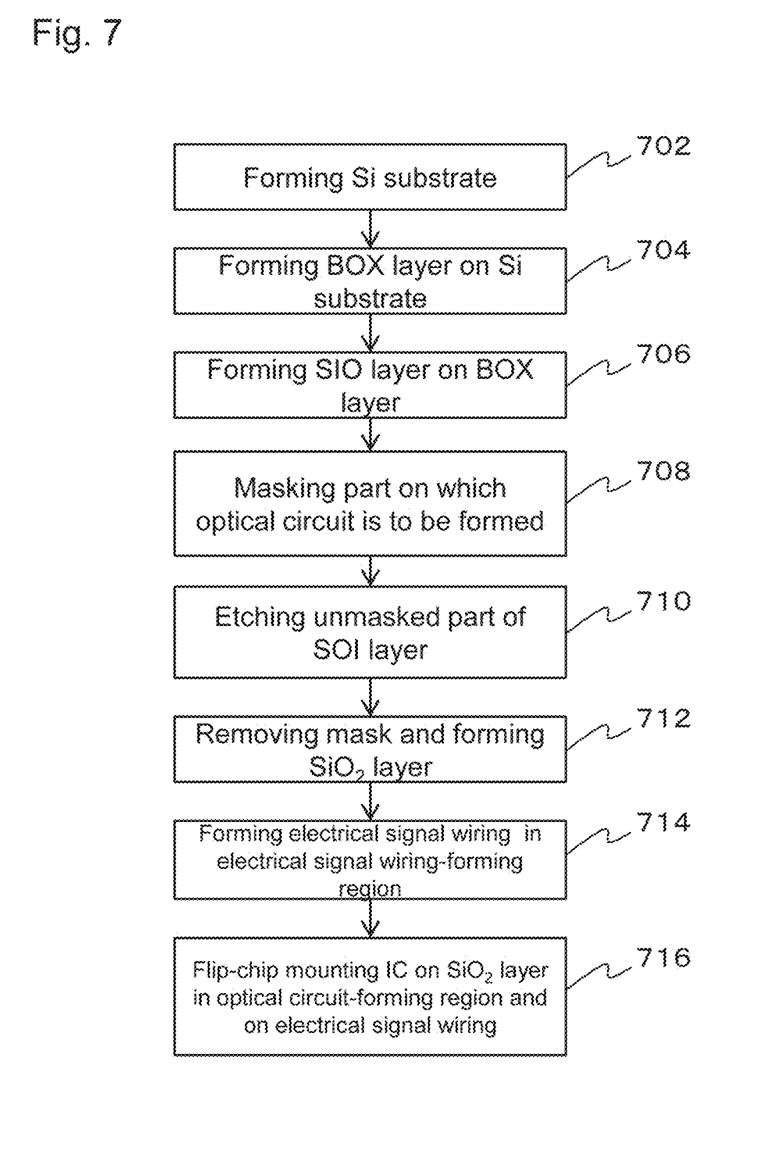
FIG. 7 is a flowchart showing a method for manufacturing the semiconductor integrated circuit shown in each of FIGS. 5 and 6.

FIG. 7 is a flowchart showing a method for manufacturing a semiconductor integrated circuit comprising an optical circuit-forming region and an electrical signal wiring-forming region, such as that shown in each of FIGS. 5 and 6, according to an embodiment of the present invention. In step 702, an Si substrate is formed. In step 704, a BOX layer is formed on the Si substrate. In step 706, an SIO layer is formed on the BOX layer. In step 708, a part of the SOI layer, on which an optical circuit is to be formed, is masked by a mask. In step 710, an unmasked part of the SOI layer is etched. As a result thereof, in the SOI layer, the part corresponding to the area in the optical circuit-forming region in which no optical circuits are to be formed, and the part corresponding to the electrical signal wiring-forming region are removed; and, thus, an SOI layer comprising an optical circuit in the optical circuit-forming region is formed. In step 712, the mask is removed; and $SiO_2$ layers are formed on the SOI layer and on the BOX layer in the electrical signal wiring-forming region, respectively. In step 714, electrical signal wiring(s) is/are formed on the $SiO_2$ layer in the electrical signal wiring-forming region. In step 716, a driver IC is flip-chip mounted, on the $SiO_2$ layer in the optical circuit-forming region and the electrical signal wiring(s) in the electrical signal wiring-forming region.

In step 708, it may be possible to mask a portion of a part of the SOI layer that corresponds to the electrical signal wiring-forming region. In such a case, an SIO layer is formed on a part of the BOX layer in the electrical signal wiring-forming region. The length of the SOI layer may be set to be equal to or less than one-fourth of a wavelength of an electrical signal that is designed to propagate through the electrical signal wirings.

Figure 8:
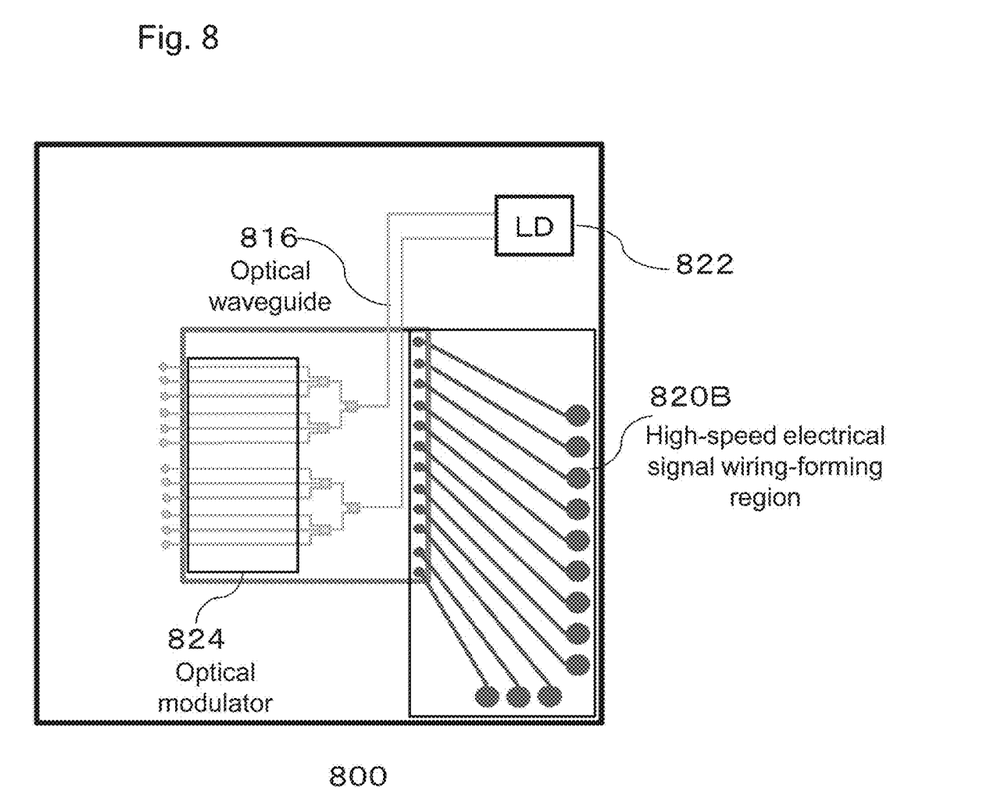
FIG. 8 is a schematic top view of a semiconductor integrated circuit according to an embodiment of the present invention.

FIG. 8 is a schematic top view of a semiconductor integrated circuit 800 according to an embodiment of the present invention. The semiconductor integrated circuit 800 is constructed in such a manner that optical circuit-forming regions 822, 824, and 826 and an electrical signal wiring-forming region 820B are arranged to be separated, at least partially, from each other. In the example shown in FIG. 8, the optical circuit may comprise a semiconductor laser (e.g., LD) 822, an optical modulator 824, and an optical waveguide 826. In this example, the optical circuit-forming region corresponds to the area in which the semiconductor laser 822, the optical modulator 824, and the optical waveguide 826 are formed. Similar to the case of the semiconductor integrated circuit 500 shown in FIG. 5, the semiconductor integrated circuit 800 may be configured by use of a method such as that shown in FIG. 7. The optical circuit-forming region comprises an Si substrate, a BOX layer formed on the Si substrate, an optical circuit (the LD 822, the optical modulator 824, or the optical waveguide 826 in the example shown in FIG. 8) formed as an SOI layer on the BOX layer, and an $SiO_2$ layer formed on the SOI layer. The electrical signal wiring-forming region comprises the Si substrate that is shared with the optical circuit-forming regions, the BOX layer that is shared with optical circuit-forming region, an $SiO_2$ layer formed on the BOX layer, and electrical signal wirings formed on the $SiO_2$ layer. The semiconductor integrated circuit 800 may further comprise an IC that is flip-chip mounted on the $SiO_2$ layer in the optical circuit-forming region and on the electrical signal wirings in the electrical signal wiring-forming region. Still further, an SOI layer may be formed on a part of the BOX layer in the electrical signal wiring-forming region. In such a case, the length of the SOI layer may be set to be equal to or less than one-fourth of a wavelength of an electrical signal that is designed to propagate through the electrical signal wirings.

While the present invention is explained with reference to specific embodiments, it is intended that the embodiments described in this specification are not used to interpret the present invention in a limiting way, and that the embodiments described in this specification are used as examples to explain the present invention. It is obvious for a person skilled in the art that other alternative embodiments can be implemented without departing from the scope of the present invention.

The invention claimed is:

1. A semiconductor integrated circuit comprising a first region on which an optical circuit is to be formed and a second region on which an electrical signal wiring is to be formed, wherein:
   the first region is configured to comprise
      a silicon (Si) substrate;
      a buried oxide (BOX) layer formed on the Si substrate;

a first SOI (Silicon on Insulator) layer formed as an optical circuit on the BOX layer; and
a first SiO$_2$ layer formed on the first SOI layer; and
the second region is configured to comprise
the Si substrate;
the BOX layer;
a second SiO$_2$ layer formed on the BOX layer; and
an electrical signal wiring formed on the second SiO$_2$ layer.

2. The semiconductor integrated circuit according to claim 1 further comprising an IC that is flip-chip mounted on an electrode formed on the first SiO$_2$ layer and on the electrical signal wiring.

3. The semiconductor integrated circuit according to claim 2, wherein a second SOI layer is formed on a part of the box layer in the second region.

4. The semiconductor integrated circuit according to claim 1, wherein a second SOI layer is formed on a part of the box layer in the second region.

5. The semiconductor integrated circuit according to claim 4, wherein the length of the second SOI layer is equal to or less than one-fourth of a wavelength of an electrical signal that is designed to propagate through the electrical signal wiring.

6. A method for manufacturing a semiconductor integrated circuit comprising a first region on which an optical circuit is to be formed and a second region on which an electrical signal wiring is to be formed, comprising:
forming a silicon (Si) substrate;
forming a buried oxide (BOX) layer on the Si substrate;
forming an SOI (Silicon on Insulator) layer on the BOX layer;
masking a part of the SOI layer, in which the optical circuit of the first region is to be formed;
etching an unmasked part of the SOI layer, wherein a first SOI layer including the optical circuit is formed in the first region;
removing the mask, and forming a first SiO$_2$ layer and a second SiO$_2$ layer on the first SOI layer and on the BOX layer in the second region, respectively; and
forming an electrical signal wiring on the second SiO$_2$ layer.

7. The method according to claim 6, wherein the masking comprises masking a portion of a part of the SOI layer that corresponds to the second region, wherein a second SOI layer is formed on a part of the BOX layer in the second region.

8. The method according to claim 7, wherein the length of the second SOI layer is equal to or less than one-fourth of a wavelength of an electrical signal that is designed to propagate through the electrical signal wiring.

9. The method according to claim 6 further comprising:
flip-chip mounting an IC on an electrode formed on the first SiO$_2$ layer and on the electrical signal wiring.

10. The method according to claim 9, wherein the masking comprises masking a portion of a part of the SOI layer that corresponds to the second region, wherein a second SOI layer is formed on a part of the BOX layer in the second region.

* * * * *